United States Patent
Hanham et al.

(10) Patent No.: US 9,407,294 B2
(45) Date of Patent: Aug. 2, 2016

(54) NON-VOLATILE MEMORY CONTROLLER WITH ERROR CORRECTION (ECC) TUNING VIA ERROR STATISTICS COLLECTION

(71) Applicant: OCZ Storage Solutions, Inc., San Jose, CA (US)

(72) Inventors: Paul Edward Hanham, Didcot (GB); David Malcolm Symons, Kidlington (GB); Neil Buxton, Reading (GB)

(73) Assignee: Kabushi Kaisha Toshiba., Tokyo (JP)

( * ) Notice: Subject to any disclaimer, the term of this patent is extended or adjusted under 35 U.S.C. 154(b) by 101 days.

(21) Appl. No.: 14/325,244

(22) Filed: Jul. 7, 2014

(65) Prior Publication Data

US 2016/0006462 A1   Jan. 7, 2016

(51) Int. Cl.

| | |
|---|---|
| *G06F 11/00* | (2006.01) |
| *G06F 11/07* | (2006.01) |
| *H03M 13/00* | (2006.01) |
| *H03M 13/11* | (2006.01) |
| *H03M 13/37* | (2006.01) |
| *H03M 13/45* | (2006.01) |
| *G06F 11/10* | (2006.01) |
| *G11C 29/04* | (2006.01) |

(52) U.S. Cl.
CPC ....... *H03M 13/3715* (2013.01); *G06F 11/1012* (2013.01); *H03M 13/1102* (2013.01); *H03M 13/458* (2013.01); *G11C 2029/0411* (2013.01)

(58) Field of Classification Search
CPC ............ G06F 11/1008; G06F 11/1048; G06F 11/1012; G06F 11/108; G06F 11/106; G11C 11/5642; G11C 16/26; H03M 13/1108; H03M 13/1111; H03M 13/1102; H03M 13/152; H03M 13/2906; H03M 13/3715; H03M 13/458
USPC .......................... 714/773, 780, 758, 755, 801; 365/185.33
See application file for complete search history.

(56) References Cited

U.S. PATENT DOCUMENTS

| | | | | |
|---|---|---|---|---|
| 8,621,318 | B1 * | 12/2013 | Micheloni | G06F 11/1012 714/755 |
| 8,935,595 | B2 * | 1/2015 | Zhong | G11C 11/5642 714/773 |
| 9,092,352 | B2 * | 7/2015 | Wang | G06F 13/4286 |

* cited by examiner

*Primary Examiner* — Phung M Chung
(74) *Attorney, Agent, or Firm* — White & Case LLP

(57) ABSTRACT

A non-volatile memory controller for a solid state drive includes a soft-decision LDPC decoder. The soft-decision LDPC decoder includes a probability generation module. A processor reads collected statistics collated from decoded frames and tunes the performance of the soft-decision LDPC decoder performance. Additional parameters may also be taken into account, such as the scramble seed and the type of non-volatile memory. An asymmetry in errors may also be detected and provided to a hard-decision LDPC decoder to adjust its performance.

28 Claims, 8 Drawing Sheets

| Read value R2R1R0 | Probability=1 |
|---|---|
| 000 | 0.01 |
| 001 | |
| 010 | |
| 011 | 0.38 ← |
| 100 | |
| 101 | |
| 110 | |
| 111 | 0.99 |

P' 0.40 — table update

FIG. 6

Binary Symmetric Channel

Binary Asymmetric Channel

MLC Cell Threshold Voltage Distributions

NON-VOLATILE MEMORY CONTROLLER WITH ERROR CORRECTION (ECC) TUNING VIA ERROR STATISTICS COLLECTION

FIELD OF THE INVENTION

The present invention is generally related to a non-volatile memory controller with improved error checking and correction. More particularly, the present invention is directed to collecting statistics about the errors in NAND flash pages during use of the NAND flash memory and then using the statistical information as an input to tune and improve the error correction capability for subsequent pages accessed from the flash memory.

BACKGROUND OF THE INVENTION

Solid State Drives (SSDs), also known as Solid State Disks, typically include a flash memory controller and associated non-volatile memory devices, such as NAND flash memories. An individual memory may store a single bit of information (a "0" or a "1") but high density memories may be multi-level memories in which the stored charge may have more than two possible levels. Error checking and correction techniques may also be included.

Due to the increasing bit density of NAND flash memories and the associated smaller process geometries, there has been greater emphasis on improving the error correction capability provided by NAND flash memory controllers. Error correction is necessary due to the nature of the technology where reliability and endurance become increasing problems as flash density increases.

NAND flash memory technology depends on the storage of a trapped charge on a floating gate of a transistor which comprises the memory cell. The amount of charge which is stored will vary the threshold voltage, VT, which is the voltage when applied to a separate control gate which will cause the transistor to conduct. In order to read the memory cell, a voltage is applied to the control gate and the current which flows between the source and drain is measured. The amount of current will vary according to the charge stored on the floating gate.

Originally, flash memory cells were designed to store only a single bit, where the cell was either programmed to store a charge, or left un-programmed with no charge stored. The threshold voltage when a charge was stored would be much higher than if it were not. In order to distinguish between the two states, a voltage would be applied which was in between the two threshold voltages. If the transistor conducted, it could be assumed that no charge was stored (as the voltage applied would be above the threshold voltage of the un-programmed cell). If, however, the transistor did not conduct, then it could be assumed that a charge was stored (as the voltage applied would be below the threshold voltage of the programmed cell).

However, the mechanism for programming a stored charge is relatively imprecise. In an array of memory cells, there may be variations in cell parameters due to the position or layout of the cells in the array. Also, process variations in the manufacture of the silicon slices to make the flash memory dies may cause variations between dies used in different devices or between multiple dies on the same device. The result of this would be that the stored charge could lie anywhere on a distribution curve, which is often approximated by a normal or Gaussian distribution due to these variations.

Similarly, the mechanism for erasing a stored charge is subject to variation, where a cell that was previously programmed and then erased, may still hold some variable amount of residual charge. Erasing flash cells is conducted in bulk, with a whole block of memory cells erased at a time. Further, with repeated erasure and re-programming, flash cells deteriorate over time and exhibit increased propensity to cell variations, until finally the cells may fail completely.

The stored charge may also be subject to modification due to effects such as leakage of charge over time due to imperfections in the insulating or semiconductor layers comprising the cell, or there may be additional charge variations due to so-called 'disturb' effects where adjacent cells being programmed or read may result in addition or leakage of charge to/from surrounding adjacent cells due to parasitic capacitance coupling and other effects.

Hence, there are many statistical and random effects upon a cell, which, while notionally initially 'programmed' to a certain charge level, might subsequently hold a charge that was lower than the voltage chosen to distinguish between the charge states, appearing on reading to be a cell that was not programmed. In effect a read error would occur. Equally, a cell that was not programmed might accumulate sufficient charge due to statistical and random effects that makes the cell appear on reading to be programmed, causing a read error in the opposite direction.

This problem is compounded by the trend to move from storing a single bit per cell in SLC (single level cell) memory towards storing 2 or 3 bits per cell in MLC (multi level cell) and TLC (triple level cell). With MLC and TLC, a single cell is still used to store a charge, but as the terms suggest, multiple levels of charge are defined to represent multiple bit states. Where two bits per cell are used, 4 levels of charge are defined, including the erased or non-charged state. Where three bits per cell, 8 levels of charge are defined. When more levels are squeezed in to the same range of charge state, the charge levels and corresponding threshold voltages become closer together. This means that closer tolerances are required in order to distinguish between the different cell charge distributions used to represent the bit states, and it also means that smaller amounts of charge injection or leakage will more easily result in movement of the stored charge from the original programmed level to adjacent levels. The net result is that with multiple bits per cell, read errors become more prevalent.

A flash memory is generally organized in units of pages which are the smallest unit which are individually programmable. A block, which is the smallest unit which can be erased, is composed of multiple pages. A page of memory is provided with a spare area, which is used for the extra bits required for ECC, as well as other functions such as bits for keeping track of wear leveling and other metadata. The spare area was originally sized to be large enough to accommodate enough bits to provide for BCH (Bose Chaudhuri Hocqenghem) type codes for error correction given the expected error rates of memories at the time. BCH error correction codes are extensively used to correct read errors in NAND flash memories, primarily because they have the property that they can be flexibly designed to correct a precise number of errors in a block of data (meaning that a data block of a given size and expected error rate can be exactly reconstructed with certainty), wherever and however they may occur (i.e. randomly distributed, in fixed patterns or in bursts). They are also relatively simple to implement decoders (usually the most complex part of an ECC codec) using the syndrome decoding algebraic method. As such, BCH codes could be specifically designed to work with a given flash memory data page and spare area size. However, the greater requirements placed on the ability to cope with greater error rates in more dense NAND flash memories, along with greater requirements for longer memory endurance in enterprise computing applications as opposed to consumer applications, has meant that BCH codes have become incapable of being economically or feasibly scaled to meet the new requirements.

As a result, Low Density Parity Codes (LDPC) codes are now commonly used. LDPC codes provide greater coding efficiency than BCH (in terms of the number of bits in data block which are in error, compared with the number of extra bits needed to form the codewords from the data block). However they suffer the disadvantage that decoding is a more complex and iterative process which may not converge to an exact answer. Their success at converging on a solution can be improved by providing additional probability information regarding the likelihood or belief about which bits are in error. With BCH codes, the result of a single read operation of a page memory cells using a single sensing threshold voltage is sufficient to operate the decoding operation. Either each bit is returned correctly, or it is in error, no information is provided about where the actual value of stored charge may lie on the possible Gaussian distribution curve. This is termed 'hard-decision' memory sensing. Alternative improved schemes have been designed which involve performing multiple read operations using different threshold sensing voltages. The results from these multiple read operations can then be used to provide additional 'soft information' which can indicate approximately where on the Gaussian distribution curve the cell charge may lie. This method is termed 'soft-decision' memory sensing. However, this method results in a much slower overall read operation, with much increased read latency considerably reducing the read I/O bandwidth. It may also only start to offer advantages as the memory ages or data retention time increases, where the cell charge moves further away from the centre of the Gaussian distribution curve and starts to enter the overlap area of the adjacent charge level distribution curves. In this case, the reduction in memory read I/O performance as the device ages may be an acceptable tradeoff in return for extending the error correction capability.

Therefore, LDPC decoding is generally conducted using hard-decision decoding in the early lifetime of the flash memory, as this offers reasonable decoder error correction capability with no loss in performance due to increased read latency. As the flash memory ages and the error rates increase, the decoding capability is increased if soft-decision decoding is employed as more information is provided to the decoder as to the likelihood of which bits may be in error, but at the expense of increased read latency and reduced read performance.

With BCH codes, as long as the number of errors in the memory page (including the extra error protection bits in the spare area) does not exceed the correction capability of the code, the original data is guaranteed to be decodable. With LDPC, this is no longer the case, and the iterative decoding process may not converge on a solution. In particular, this may happen even if there are only a low number of errors in the page, which is more likely to happen early in the life of a NAND flash memory when error rates are low. If the decoding does not converge on a solution, this means that no information can be discerned with any certainty about any of the bits in the whole page which may be in error, effectively resulting in the whole page being rejected and a page read error being returned, which is a major failure in the read process. This may happen early in the life of the memory, where it would be expected that low rates of error can be corrected easily. It is only when the memory ages or data is retained for long periods that error rates rise to such an extent that the error correction cannot cope.

In soft-decision decoding, the resulting page error rate is very dependent on the quality (accuracy) of the soft information. While multiple reads do provide soft information in terms of the likelihood of the bit being read being a '0' or a '1', it applies only to that instance, where the bit has either been written as a '0' or a '1'. However, it is known, for example, that bit positions in flash pages may have asymmetrical error properties, where the likelihood of a '0' written to the flash turning into a '1' is very different from the likelihood of a '1' becoming a '0'. Also, error properties may vary between odd and even flash pages and the position of a page within a flash data block.

Alternative non-volatile memory technologies are already in use, including Phase Change Memory (PCM), Magneto-resistive RAM (MRAM), Spin Torque Transfer MRAM (STT-MRAM) Ferro-electric RAM (FeRAM or FRAM). Although based on different technologies, these memories also suffer from memory cell corruption and data read errors, where the use of LDPC using soft-decision decoding may be appropriate as an error correction technique.

Therefore, what is needed is a method to improve upon the quality of the soft information concerning error likelihoods based on multiple reads of a non-volatile memory, by collecting statistics on actual error properties of memory pages which have been corrected in the past to adjust error properties of future memory page reads.

SUMMARY OF THE INVENTION

An apparatus, system, method, and computer program product is disclosed to dynamically monitor output errors in a soft-decision LDPC decoder during the lifetime of a non-volatile memory, including a NAND flash memory. The error information is used to generate information to improve the operation of the soft-decision LDPC decoder. Additionally, asymmetry information may be provided to a hard-decision LDPC decoder to improve its performance.

In one embodiment, a Low Density Parity Check Decoder (LDPC) of a flash memory controller decodes flash memory pages. Monitoring is performed during use of the flash memory controller to detect statistical errors in a decoded output of the soft-decision LDPC decoder. Updates are generated for a probability lookup table (LUT) that is used by the soft-decision LDPC decoder to determine a transformation between a set of soft-decision read values and a probability of a bit having a value of zero or one.

BRIEF DESCRIPTION OF THE DRAWINGS

FIG. 6 illustrates an example of a LUT table in accordance with an embodiment of the present invention.

DETAILED DESCRIPTION

Figure 1:
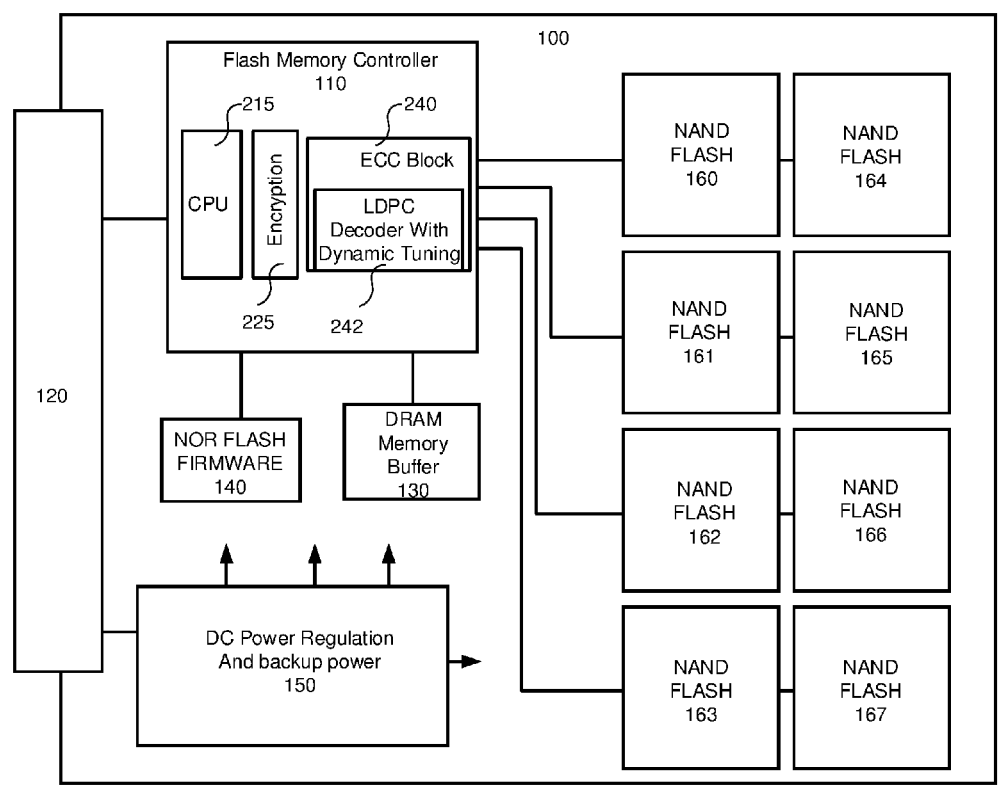
FIG. 1 is a block diagram of solid state drive illustrating a flash memory controller having a tunable soft-decision LDPC decoder in accordance with an embodiment of the present invention.

FIG. 1 shows a solid state drive (SSD) ecosystem for understanding aspects of the present invention. A SSD may include a flash memory controller 110 in combination with other components such as NAND flash memory devices. The flash memory controller 110 provides the link between the storage or expansion bus interface 120 (which may be SATA, SCSI, SAS, PCIe or similar) and the NAND flash memory devices themselves, 160-167. The number of flash memory devices may vary according to the storage capacity of the individual devices and the SSD as a whole, but would typically be a power of 2 such as 4, 8, 16, 32 and so on. The flash memory controller may comprise a single semiconductor device with on-chip ROM for firmware storage and RAM for working data structures and buffers, but there may also be provided external DRAM 130 for additional space for large data translation tables and buffers and external NOR flash 140 for upgradeable firmware storage. To provide the various voltages required by the flash memory controller and external memories, there will be DC power regulation circuitry 150 which may also include provision for backup power using large capacitors in order to safely manage the shutdown of the SSD in the event of sudden power removal or failure.

The flash memory controller 110 may include an Encryption block 225 and an Error Correction (ECC) block 240 that includes a LDPC Decoder block 242 that collects output error statistics of a soft-decision LDPC decoder to tune the soft-decision LDPC decode. As will be discussed later in more detail, a CPU 215 may read statistics collected by the LDPC decoder block and use these statistics to tune a relationship between soft-decision read values and a probability a bit value is a binary zero or one. Additionally, in one embodiment asymmetry error information is used to tune a hard-decision LDPC decoder.

Figure 2:
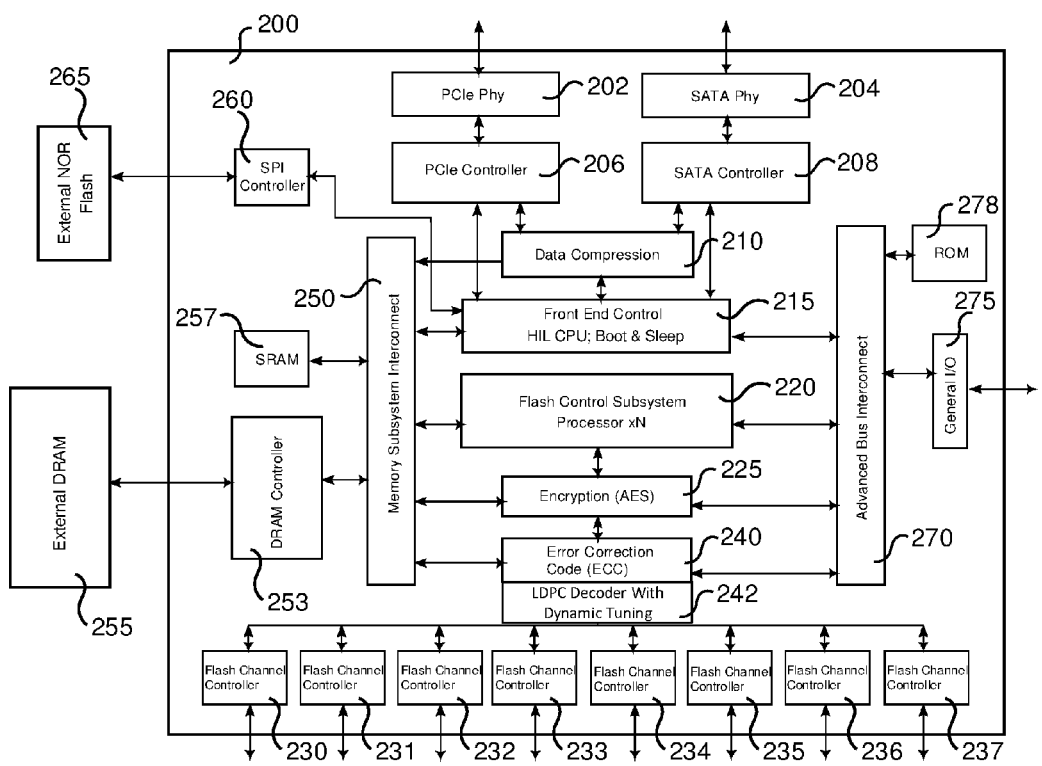
FIG. 2 is a block diagram of a flash memory controller in accordance with an embodiment of the present invention.

FIG. 2 shows a block diagram of a flash memory controller device used in a solid state disk (SSD) in accordance with an embodiment of the present invention. In FIG. 2, the flash controller 200 is largely self contained, with External DRAM 255 and External NOR Flash 265 being the main external components apart from the NAND flash memory itself (not shown but which connects via flash control/data buses to the Flash Channel Controllers 230-237). Data is transferred between a host and the flash memory controller via PCIe Physical Layer 202 and SATA Physical Layer 204 and PCIe Controller 206 and SATA Controller 208 protocol stacks.

Data may then pass through data compression/decompression 210 or be buffered directly in DRAM 255. These PCIe and SATA functions operate under the control of a Front End Control unit 215, which contains the Host Interface Layer (HIL) CPU and a separate low power control processor subsystem which is responsible for managing low power operation sleep modes.

The Front End Control 215, Flash Control Subsystem 220, Encryption (AES) 225 and Error Correction Code (ECC) 240 hardware blocks are interconnected with a high bandwidth Memory System Interconnect 250 and an Advanced Bus Interconnect 270. Bulk data and critical data interchange between these components takes place on the Memory System Interconnect 250 while control and non-critical data interchange takes place via the Advanced Bus Interconnect 270.

Both high speed on-chip SRAM 257 is used along with bulk external DRAM 255 via a DRAM controller 253. The Flash Control Subsystem 220 runs the flash firmware to manage the reading and writing of data in flash data pages and blocks to the NAND flash memories. Hardware blocks are provided to implement high speed data encryption and decryption to the AES standard 255 and also real time Error Correction Code (ECC) 240 encoding and decoding. Data is exchanged between the front end Data Compression 210 hardware block and the back end AES Encryption 255 and Error Correction Code 240 hardware blocks by intermediate storage of data buffer in SRAM 257 and External DRAM 255.

All data passes through the AES Encryption 225 and Error Correction Code 240 blocks before finally data is distributed to the NAND flash memory devices via multiple Flash Channel Controllers 230-237, where individual channels may be supporting multiple NAND flash read or write commands in parallel. General purpose I/O lines 275 are provided for functions such as external power management.

Figure 3:
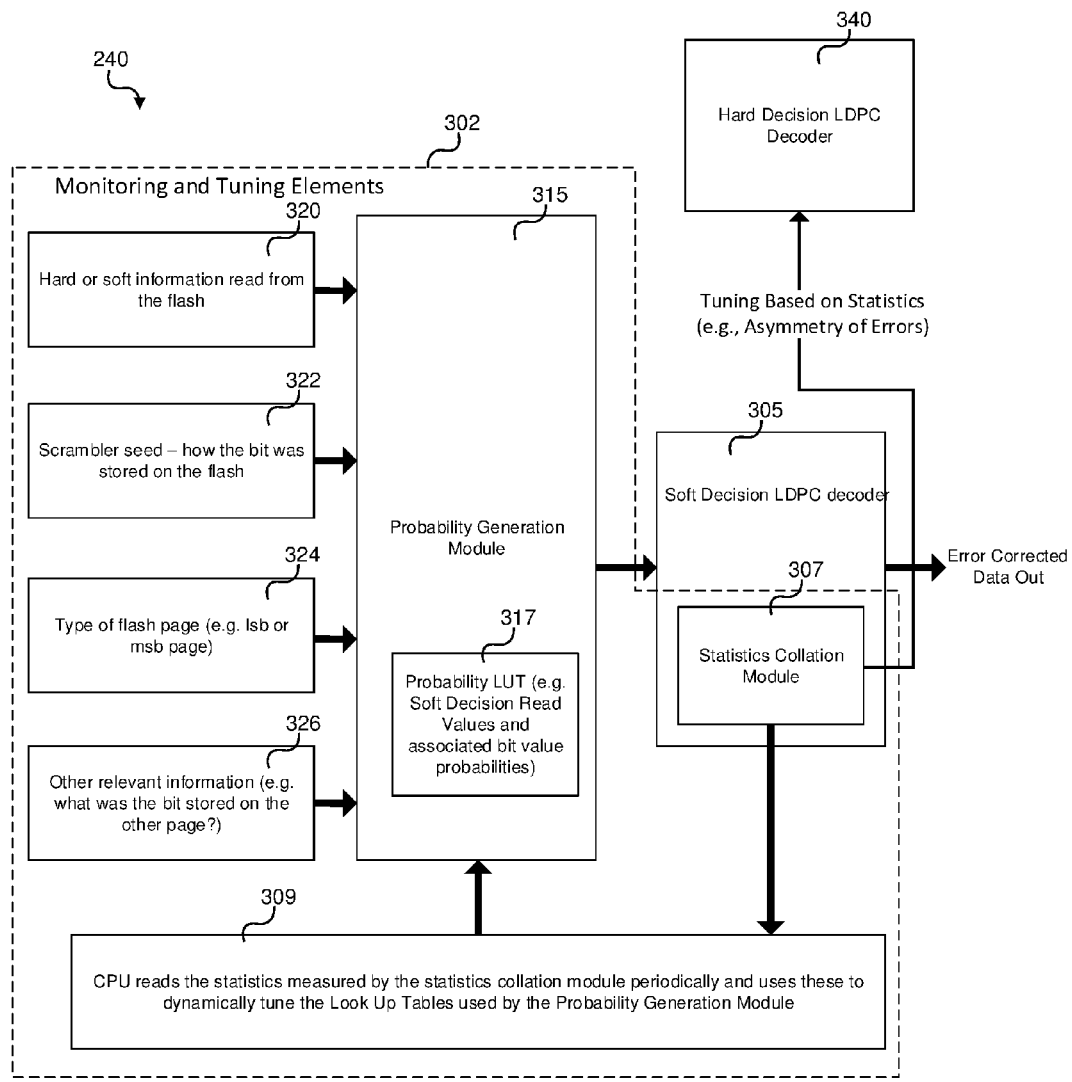
FIG. 3 illustrates a tunable soft-decision LDPC decoder in accordance with an embodiment of the present invention.

An exemplary apparatus and system for implementing a LPDC decoding block 240 with dynamic tuning is now described in regards to FIG. 3. A soft-decision LDPC decoder 305 includes a combination of features that act as a tuner 302 to dynamically tune the performance of the LDPC coding during the lifetime of the flash controller by adjusting a probability for individual bits in order to address various errors and biases of the soft-decision LDPC decoder. In one embodiment a statistics collation module 307 is provided, which may (as one option) be located in the LDPC decoder 305. In particular, the soft-decision LDPC decoder receives soft information as its input and after the decode process it outputs a decoded page as a sequence of bits with the errors corrected. The error statistics are collated for one or more frames and these statistics can be used to improve the decoding performance for subsequent frames for the soft-decision LDPC decoder and also provide asymmetry information to improve performance of hard-decision LDPC decoder.

A probability generation module 315 may be implemented as hardware and software that stores information that defines a relationship between soft-decision read values and a bit probability value. In one embodiment the probability generation module 315 stores a probability Lookup Table (LUT) 317, that will be understood may also be implemented, if desired, as a set of LUTs or other equivalent data structure. The probability LUT 317 may, for example, summarize relationships between soft-decision read values and a probability of a bit value being a binary zero or a one.

The output provided to the soft-decision LDPC decoder 305 from the probability generation module 315 is a probability value for each of the bits in the frame, based on a set of soft-decision read values. In one implementation, the probability value is a probability that the bit is a 1. For example, suppose that at some initial time that there is relationship in which a set of read values maps to a certain probability value. Over time there may be a number of read/write/erase operations which alter the operation of individual memory cells. By monitoring error statistics, the relationship between soft-decision read values and probability values may be adjusted. As a result the performance of the soft-decision LDPC decoder is improved and Frame Error Rates (FER) are reduced in comparison to utilizing a static relationship at the time of manufacture.

The probability generation module may include inputs indicative of initial biases for a flash page, including input parameters such as whether hard or soft information 320 is read from the flash, a scrambler seed 322, the type of flash page 324 (e.g., lsb or msb page) or other relevant information 326. In particular, the probability LUT may have values determined by one or more input parameters relevant to a flash page and further adjusted by the monitored error statistics.

A processor/controller, such as a CPU 309, reads the statistics measured by the statistics collation module 307 and uses these to dynamically tune the look up tables used by the probability generation module 315. The Frame Error Rate of the soft-decision decoder 305 (that is the proportion of the frames where some of the errors are not corrected) is very dependent on the quality of the input soft-information. The present invention improves the quality of this information and therefore improves the performance of the soft-decision LDPC decoder.

The probability LUT maps the composite soft-decision read values to a probability. In a soft-decision LDPC decoder 305, the flash page may be read at multiple values of the threshold voltage so that each bit is not just a '0' or a '1' but can be somewhere in between. In one embodiment the automatic soft reads provided by the flash generally give 3 bits of soft information or 8 levels from '0' to '1'. Thus, in this example there are a set of soft read values based, in part, on the number of bits to be read. This soft-information is transformed into probabilities before being fed into the soft-decision LDPC decoder. The quality of this transformation can be improved by using the input parameters to the probability generation module and the information provided by the statistics collation module 307.

One aspect of the present invention is that quality of the transformation can be improving by providing other information as inputs to the probability generation module 315. For example, the transformation can be further improved by knowing whether the page is an lsb or msb page in a multi-level cell (MLC) flash and also by knowing the bits stored in other adjacent or neighboring cells. This information may, for example, be used at some initial time to generate an initial set of LUT values which is then later refined by the monitored error statistics. That is, the probability generation module may use one or both of the input parameters and the collected statistics in order to tune the performance of the soft-decision LDPC decoder.

In one embodiment, the Soft-decision LDPC decoder 305 collects the following statistics. For each of the set of soft-decision read values, the decoder measures the number of times that this bit is correctly decoded to a '0' and the number of times that it is correctly decoded to a '1'. The data is scrambled before writing it to the flash page and the decoder knows whether each bit was stored on the flash as a '0' or a '1'. These statistics are collated for each of the frames that pass through the soft-decision decoder and are used to dynamically tune the probability information for subsequent frames.

In some situations flash pages may have asymmetrical errors, that is the likelihood of a '0' written to the flash turning into a '1' is very different from the likelihood of a '1' becoming a '0'. In one embodiment, the statistics collation module 307 in the soft-decision LDPC decoder will detect this situation. This information can also be provided to a hard-decision LDPC decoder 340 to tune its behavior based on the asymmetry. The performance of the hard-decision LDPC decoder 340 can then be improved by changing the voting behavior when deciding whether to flip bits or not, provided that the hard-decision decoder knows how the bits are stored.

In one embodiment, the soft-decision decoder 305 stores the input probability values in a RAM and the decoded output is stored in another RAM. When the decode process terminates successfully and there are no errors, the statistics collation module 307 will count the number of times that a particular input probability value results in an outputted bit of '0' and the number of times it results in an outputted bit of '1'. The soft-decision LDPC decoder is also given the scrambler seed as an input and therefore knows whether each bit was stored as a '0' or a '1' on the flash.

In one embodiment, hard or soft information is read from the NAND flash and is input into the Probability Generation module 315. The probability generation module 315 also uses the output from a scrambler module (so that it knows how the data was stored on the flash), the type of flash page in use and any other relevant information, such as the bits stored in the other cells, including so called 'forwards and backwards' bits of neighbouring cells of an MLC flash. In one embodiment, the probability Generation Module 315 transforms all this input data into an output probability using a Look Up Table (LUT). A CPU reads the statistics from the Statistics Collation Module 307 and it dynamically updates the values in the LUT so that the probabilities used as inputs to the Soft-Decision LDPC decoder are as accurate as possible, thus improving the error correction performance of the decoder.

The information outputted by the statistics collation module will indicate the asymmetry in the errors. If this asymmetry is large enough that the performance of the hard-decision LDPC decoder can be improved by making use of this known asymmetry, then the hard-decision LDPC decoder is switched into an asymmetric mode and it remains in this mode until the asymmetry drops below this threshold again. To make use of this feature the hard decoder would need to be provided with the output of a scrambler module so that it knows how each bit is actually stored.

One aspect of the present invention is that it may be used to improve the quality of the input information provided to the soft-decision and hard-decision LDPC decoders and therefore improves their error correction capability. The soft-decision decoder collects statistics and these are used as a feedback mechanism to dynamically tune the input information for subsequent input frames.

A prototype was tested using software models of soft-decision and hard-decision LDPC decoders. In one test, a soft-decision LDPC decoder reduces the FER by a factor of 10 for the situation where it is known that '0's change to '1's 40 times more often than '1's change to '0's.

Figure 4:
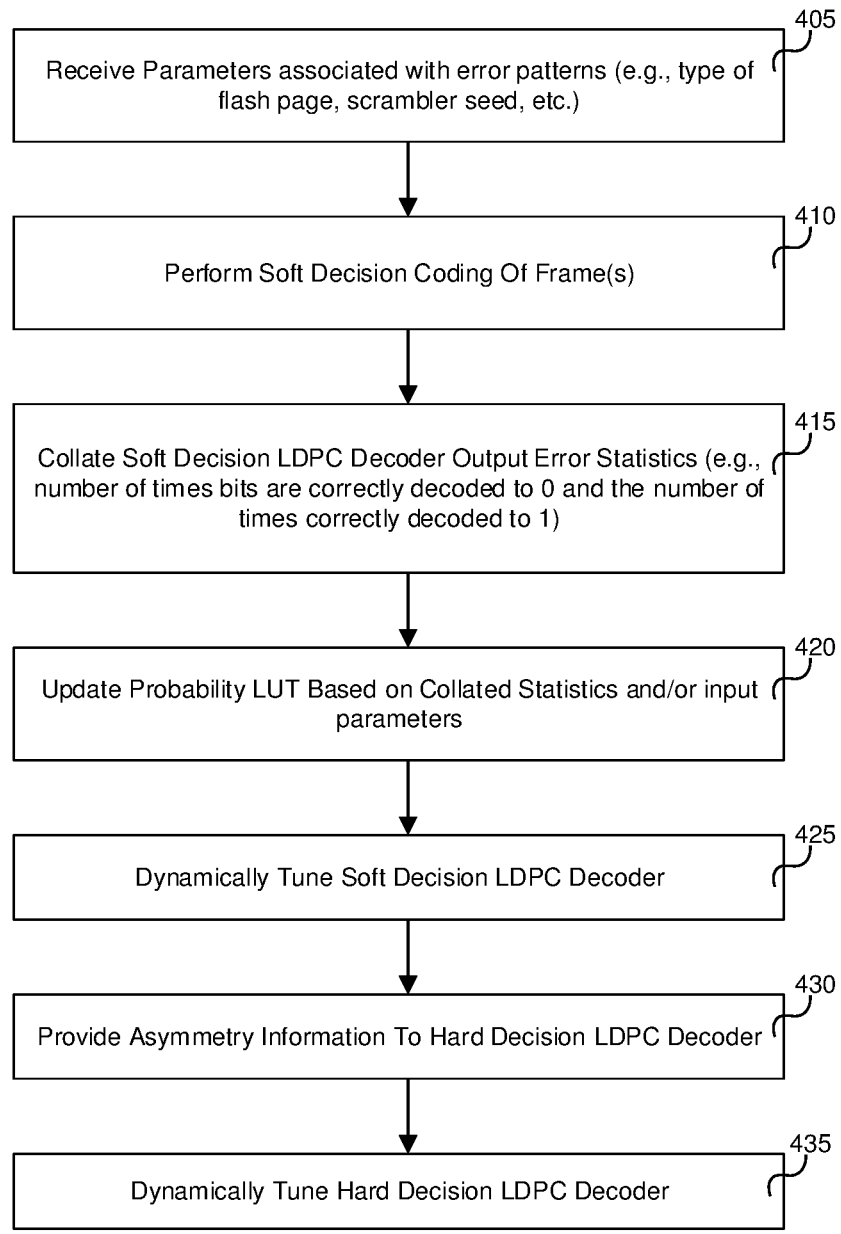
FIG. 4 illustrates a method in accordance with an embodiment of the present invention.

FIG. 4 illustrates a method in accordance with an embodiment of the present invention. In block 405, parameters are received that are associated with error parameters. In block 410, soft-decision LDPC decoding is performed of frames. In block 415 the output error statistics of the soft-decision LDPC decoder are collated. In block 420, the probability LUT is updated. In block 425 the operation soft-decision LDPC decoder is tuned based on the updated probability LUT values. In block 430 the asymmetry information, based on the error statistics, is provided to the hard-decision LDPC decoder. In block 435 the operation of the hard-decision LDPC decoder is tuned based on the asymmetry information. In dynamic tuning is performed based on one or both of the input parameters and the collated statistics. In block 425, optional tuning of the hard-decision decoder is performed.

Figure 5:
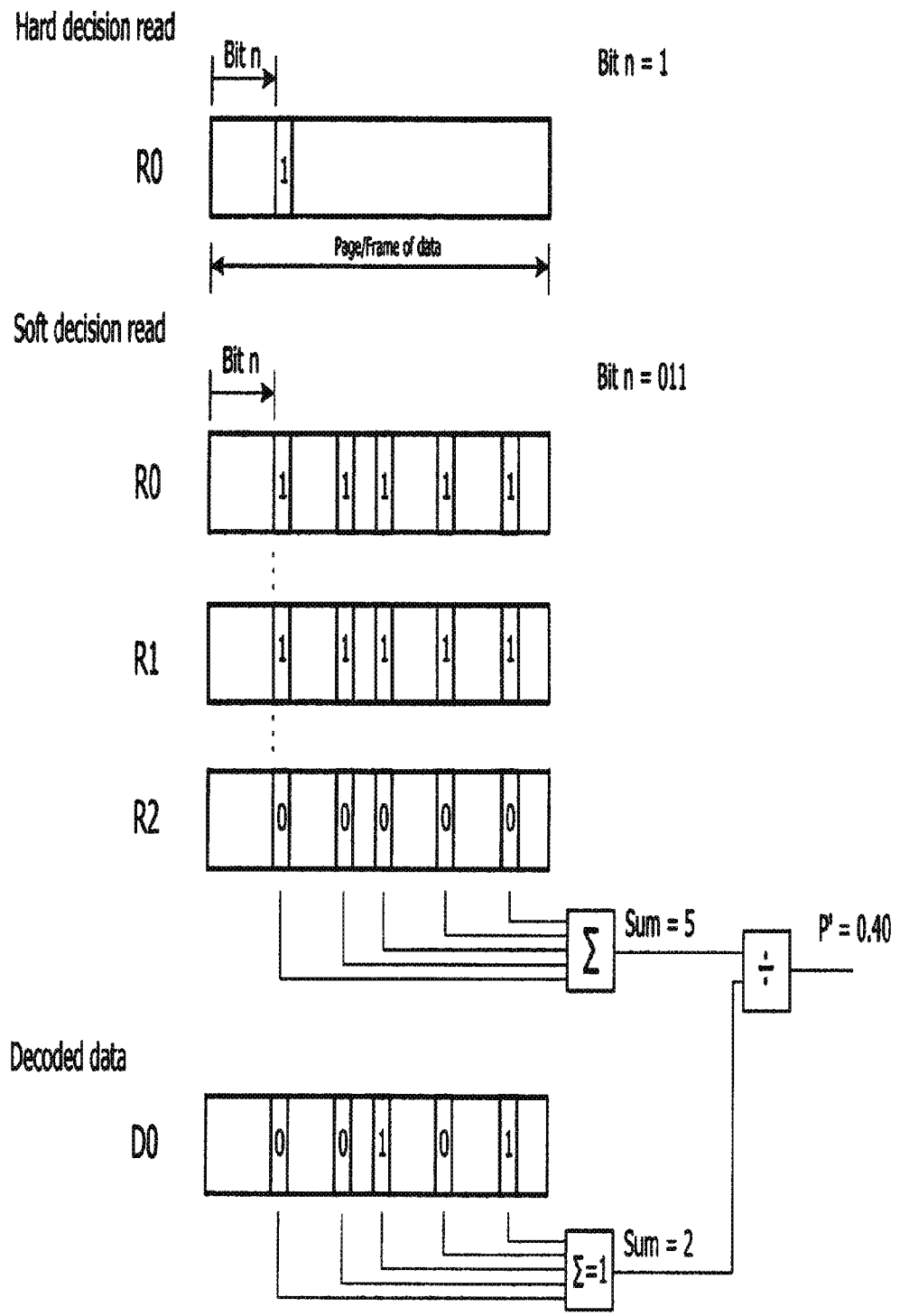
FIG. 5 illustrates an example of a soft-decision read in accordance with an embodiment of the present invention.

Additional examples are now described with reference to FIGS. 5 and 6. FIG. 5 illustrates aspects of hard-decision decoding and soft-decision decoding. With hard-decision decoding, a single data read (e.g., R0) is performed, resulting in a single set of 1s and 0s for all the bit positions in the data page (or frame). When using soft-decision decoding, multiple reads of the same page or frame of data are performed, resulting in multiple different sets of 1s and 0s which are accumulated. Typically, 7 reads (providing 8 voltage decision levels which can be binary encoded into 3 soft read bits, e.g., R0, R1, and R2) may be performed, using a threshold voltage at a nominal mid-way point between the expected cell charge distributions and at voltages above and below this central position. In this way, 3 soft-decision bits are accumulated for each bit position in the frame, which can be expressed as a composite 3 digit binary number between 0 and 7. In general a number of reads which provided N soft-decision bits would require $2^N$ (two raised to the power of N) voltage decision levels and $2^N-1$ (two raised to the power of N, minus 1) soft-decision reads to be made.

The probability LUT (Look Up Table) can then relate this number to a probability that the bit is a 0 (or equivalently, that the bit is a 1). Only one probability value is required as the other probability can be derived by the fact that the sum of both must equal 1. At a minimum, the LUT must have $2^N$ (wherein N is a superscript, representing 2 to the power of N) probability values stored, where N is the number of soft-decision bits.

An example probability LUT is shown in FIG. 6. The composite binary values on the left hand side are each related to a probability value (in this case the probability that the bit is a 1, being a number whose value ranges between 0 and 1) on the right hand side. In the example shown, if the composite value R2R1R0 is 000, the probability that the bit in the frame is a 1 is 0.01 (i.e. very low probability that the bit is a 1, or equivalently, a high probability of 0.99 that the bit is a 0). If the composite value is 111, the probability is 0.99 that it is a 1. If the composite value is 011, the probability is 0.4, in other words a 40% probability that the bit is a 1. A value of 0.5 would mean that it is equally likely that the bit is a 0 or a 1. Although the probability values here are described in terms of simple probability p, ranging from 0 to 1, a more useful form to store in the probability LUT is the probability value expressed as the Log Likelihood Ratio, LLR, which is log(p/(1−p)), where p is the simple probability. This eases computation as LLR values may be added and subtracted, whereas simple probability must be multiplied and divided.

Note that the precise probability values will vary according to the particular electrical characteristics of the flash memory device being used. Approximate initial values may be based on spreading the probability values corresponding to the composite values equally in the range 0 to 1, or they may be based on knowledge of the position of the charge distribution curves or based on direct prior measurement. However accurate these initial values may be, the electrical characteristics of flash memory change when the memory is subject to an increasing number of program/erase cycles as the device ages. Therefore it is an object of this method to increase the accuracy of the probability values, by basing updates to the probability values based on actual read measurements on the flash device.

The probability statistics may also vary from flash device to flash device, and between different dies packaged in the same device, therefore there may be multiple probability LUTs per flash device. Variations may also occur according to the position of a flash page within an erase block, therefore the size of the LUT may be a larger number than 2N, for example up to 256 entries, to accommodate 16 different LUTs of length 8 which are used for 16 different flash page zones within an erase block.

The probability values for each of the bits in the data page or frame are used as inputs to the soft-decision decoder (as opposed to the single set of actual data bits read in a hard-decision decoder). The output of the decoder will be the error corrected page or frame of data. This information can then be fed back to be used in conjunction with the original composite read values, R2R1R0. Referring back to FIG. 5, for any given composite value, the total number of bit positions in the data page or frame having this value is summed, then the same bit positions of the decoded page or frame are checked and the number of bits with a value of 1 are summed. The new probability P' that a bit of given composite value is a 1 is then the second sum divided by the first. In the example shown, for the composite value 011, the total number is 5 and the number with the value of 1 is 2, so that the new probability P' is 2/5 which is 0.40. This value can then be used to directly update the LUT, but in order to obtain a more accurate average which is less likely to be affected by individual stray results, a large number of such results may be accumulated over time and then the average may be used to update the table.

Figure 7:
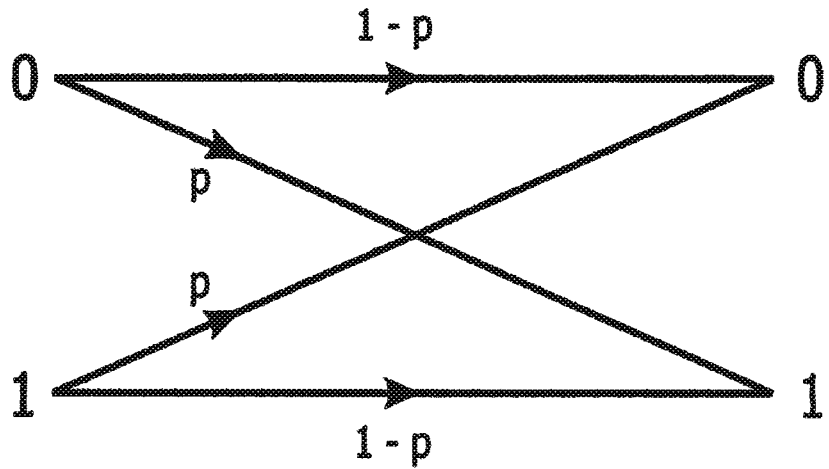
FIG. 7 illustrates Binary Symmetric Channel transitions in accordance with an embodiment of the present invention.
Figure 7:
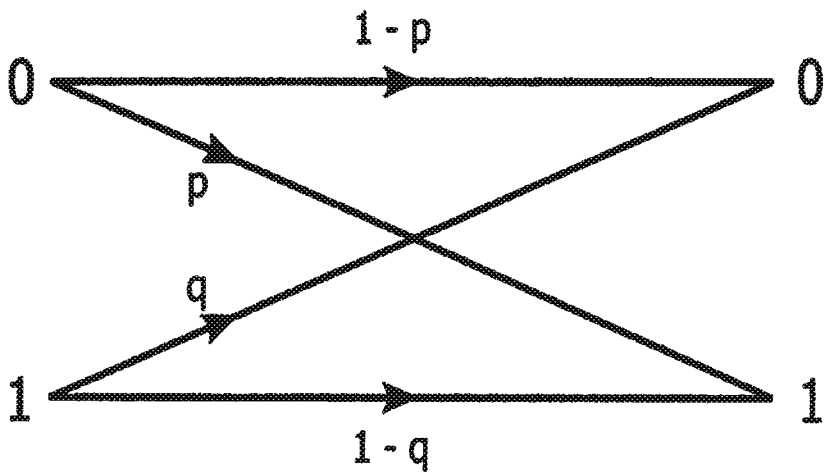
Figure 8:
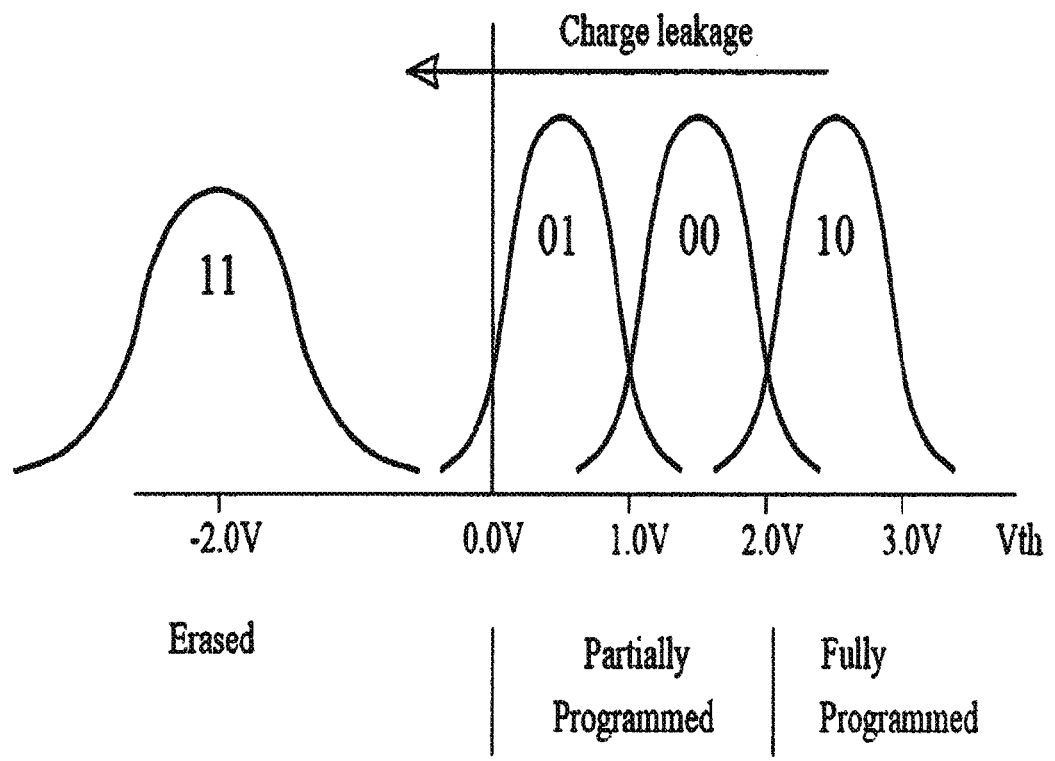
FIG. 8 illustrates MLC cell threshold voltage distributions in accordance with an embodiment of the present invention.

Additional examples are now described for the use of error asymmetry in the LDPC hard-decision decoder with regards to FIGS. 7-8. There is generally an implicit assumption in conventional error correction schemes concerning the symmetry of bit errors. The assumption is that it is equally likely for an error to occur by a 0 bit changing to a 1, or a 1 changing to a 0. For example, in a digital data transmission system, two different voltage levels may be defined to represent the transmission of a 0 or a 1 bit. To determine which bit has been transmitted, the receiver will choose a decision voltage which lies mid-way between the two levels. During transmission, the bit may be subject to electrical interference or noise and this will affect the received voltage, but the likelihood that the received voltage will be increased will be the same as if it were decreased. Therefore, it becomes equally likely that a 0 may be increased to the level at which it becomes detected as a 0, as a 1 will be decreased to the level at which it will be detected as a 0. Hence, 0 to 1 errors are equally as likely as 1 to 0 errors. This can be represented as shown in FIG. 7, where a 0 to 1 transition between transmitted bits and received bits occurs with probability p. It follows that 0 to 0 transitions occur with probability 1−p. Similarly, 1 to 0 transitions occur with the same probability p and 1 to 1 transitions with probability 1−p. A digital communications channel with such error characteristics is termed a 'Binary Symmetric Channel' (BSC).

In practice, many systems do not exhibit the simple characteristics of a BSC. For some time, storage systems have been modeled as Binary Asymmetric Channels, where the probability of a 0 to 1 transition is p, but the probability of a 1 to 0 transition is different, q. In NAND flash memory, there are many sources of errors both during the writing of data and the reading of data. A major contribution to errors is the effect of charge leaking from the memory cell, where the amount of leakage will increase as the length of time that the charge has been retained in the cell, giving rise to so-called 'retention errors.' A very likely cause of error therefore is a cell where the charge has leaked to the point where the remaining charge drifts into range of charge stored by an adjacent charge level corresponding to a different encoded bit combination.

In SLC NAND flash, only two charge levels are stored, corresponding to a 1 and a 0. The erased, or no charge state, conventionally corresponds to 1, with the charged state corresponding to a 0. Retention errors caused by charge leakage will cause a stored bit of 0 to be recognized as a 1. While errors caused by charge injection, which may cause a 1 to be recognized as a 0, this is much less likely to occur than charge leakage. Therefore, errors in SLC NAND flash, for which retention errors predominate, are more likely to be errors where a 0 which was written is subsequently read as a 1, rather than a 1 being read as a zero.

In MLC flash, multiple charge states are used with multiple bits encoded into each charge state. FIG. 8 shows a schematic example of the typical threshold voltage distributions of a 2 bit MLC NAND memory cell in its erased and programmed states. The threshold voltage is the voltage which, when applied to the control gate of the cell transistor, will cause the transistor to conduct. The more charge that the cell transistor stores on its floating gate, the higher the threshold voltage required. Charge leakage causes the threshold voltage to be reduced, which, when the cell is read, can cause the data to be mis-interpreted. There is first form of asymmetry caused by the fact that the erased state has a more spread out voltage distribution and whose peak is more than 2V distant from the nearest partially programmed state. The remaining partially programmed and fully programmed states are spaced closer together, with peaks about 1V distant from each other. This means that, for a given amount of charge leakage that could be expected over a given period of time, there is more likely to be movement from the fully programmed state to the second, intermediate programmed state and also from that state to the first partially programmed state. Movement from this state to the erased state, or movement between 2 states, are much less likely to happen, as they require much greater leakage of charge.

It follows therefore, that the type of errors resulting from retention leakage will most likely cause MLC errors of '10' to '00' and '00 to 01' with the allocation of MLC bits to charge states as shown (other allocation scheme may be adopted, so the precise bit pair transitions which may occur may differ). In this example, transitions between '10 to 01', '10 to 11', '00 to 11' and '01 to 11' due to retention leakage are much less likely to occur. Coupled with the fact that transitions which involve an increase in charge (generally associated with program disturb type effects), which are much smaller in effect when compared with retention effect errors. This creates asymmetry in the individual bit error transitions possible, as for the MSB position, 1 to 0 error transitions become much more likely than 0 to 1 transitions. While for the LSB position, 0 to 1 transitions are much more likely than 1 to 0 transitions.

Now, the error characteristics of a flash device could be modeled in advance based on estimations of the various error producing effects, but due to the differences between different types of flash devices and the fact that error characteristics vary according to the age of the data being read, it is difficult to do this with any accuracy. However, the basic error asymmetric can be measured using live data by the following technique: the raw page/frame data is read, then error corrected and the error corrected data is compared to the raw data. The number of bits which have been corrected (flipped from 0 to 1 or from 1 to 0) is counted, then the number of these which were corrected from 0 to 1 is counted. This statistic is measured over a period of time and averaged. For symmetric errors, the percentage of 0 to 1 error transitions should be 50. A lower ratio, e.g. 45 indicates a bias towards 1 to 0 transitions which will occur 55% of the time. A higher ratio, e.g. 60, indicates a bias towards 0 to 1 transitions since 1 to 0 transitions will occur only 40% of the time.

Any such bias can be used directly in the LDPC harddecision error decoding scheme, which assumes a majority voting method using the number of check nodes which will indicate if the data node should be 1 or 0. Using the knowledge of the raw data bit which was read (which requires that any modification of the original data written, using a pseudorandomizing scrambler for example), if the raw data was 0, then the check nodes will be indicating that this data suffered a read error and was originally written as a 1. This implies that a 1 to 0 transition occurred, but from the averaged statistics it is known statistically that the 1 to 0 transition will occur only 40% of the time. The voting scheme can then be adjusted by some factor, 50/40 say, so that it requires 5/4 more check nodes to establish a majority vote to correct the bit to a 1. Conversely, if the statistics gathered indicate that on average, 1 to 0 transitions occur 60% of the time, the majority voting can be relaxed by a factor of 50/60, so that fewer check nodes being 1 are needed to establish a majority vote to correct the bit to a 1.

In one embodiment, this individual process is repeated for each of the possible composite read values in the page or frame of data and then the whole process for all values repeated at intervals during the lifetime of the flash memory. This will ensure that any aging effects on the electrical characteristics of the flash memory will be compensated for by changing the LUT probability tables which keeps the softdecision decoder working optimally with the most up to date estimates of bit value probability based on actual measurements.

While the invention has been described in conjunction with specific embodiments, it will be understood that it is not intended to limit the invention to the described embodiments. On the contrary, it is intended to cover alternatives, modifications, and equivalents as may be included within the spirit and scope of the invention as defined by the appended claims. The present invention may be practiced without some or all of these specific details. In addition, well known features may not have been described in detail to avoid unnecessarily obscuring the invention. In accordance with the present invention, the components, process steps, and/or data structures may be implemented using various types of operating systems, programming languages, computing platforms, computer programs, and/or general purpose machines. In particular, while the invention has been described in terms of embodiments of a memory controller for NAND flash memory, it will be understood that it may also be used for a memory controller for other types of non-volatile memory in general, including Phase Change Memory (PCM), Magnetoresistive RAM (MRAM), Spin Torque Transfer MRAM (STT-MRAM) Ferro-electric RAM (FeRAM or FRAM). In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. The present invention may also be tangibly embodied as a set of computer instructions stored on a computer readable medium, such as a memory device.

What is claimed is:

1. A method of decoding non-volatile memory pages of a non-volatile memory, comprising:
    collating error statistics in a decoded output of a softdecision Low Density Parity Check (LDPC) decoder utilizing a probability to decode the non-volatile memory pages, the probability based on a set of softdecision read values; and
    updating, based on the error statistics, a probability lookup table (LUT) used to determine, from the set of softdecision read values, the probability of a bit in the non-volatile memory page having a particular binary value.

2. The method of claim 1, wherein the collating and updating is performed to adapt to aging related changes in multilevel cell threshold voltage distributions of the non-volatile memory.

3. The of claim 2, wherein the collating and updating is performed periodically over a lifetime of the non-volatile memory.

4. The method of claim 1, wherein the probability LUT is updated based on the collated error statistics and a set of parameters for the non-volatile memory pages being decoded that includes at least one of a type of page, a scramble seed type, and whether hard or soft information is read from the non-volatile memory.

5. The method of claim 1, wherein the soft-decision LDPC decoder performs ($2^N-1$) (2 to the power N, minus 1) soft read decision reads, the results of which are encoded as N soft-decision read values R0, R1, ... $R_{N-1}$, to determine a bit value and the probability LUT maps a composite read value $R_{N-1}$ ... R1R0 to a probability value that the bit has a value of zero or one.

6. The method of claim 1, wherein for each of the set of soft-decision read values, error statistics are collated on a number of times that a bit is correctly decoded to a binary zero and a number of times that a bit is correctly decoded to a binary one.

7. The method of claim 6, wherein error statistics are collated for at least one frame that passes through the soft-decision LDPC decoder and are used to dynamically update the probability LUT for subsequent frames.

8. The method of claim 6, further comprising determining asymmetry errors in the error statistics.

9. The method of claim 8, further comprising providing asymmetry information to a hard-decision LDPC decoder to adjust a bit flipping voting decision in response to the determined asymmetry.

10. The method of claim 1, wherein the non-volatile memory is a NAND flash memory.

11. The method of claim 1, wherein the probability is provided by a probability generation module.

12. In a Low Density Parity Check (LDPC) decoder of a non-volatile memory controller, a method of decoding non-volatile memory pages of a non-volatile memory, comprising:
  providing information to a soft-decision LDPC decoder to decode the non-volatile memory pages, the information relating a measured set of soft-decision read values to a probability that a bit value has a value of zero or one;
  collating error statistics in the decoded output of the soft-decision LDPC decoder; and
  updating based on the error statistics, the probability of the bit having a value of zero or one for the measured set of soft-decision read values.

13. The method of claim 12 further updating the probability based on the collated error statistics and a set of parameters for non-volatile memory pages being decoded that includes at least one of a type of memory page, a scramble seed type, and whether hard or soft information is read from the non-volatile memory.

14. The method of claim 13, wherein the for each of the set of soft-decision read values, error statistics are collated on a number of times that a bit is correctly decoded to a binary zero and a number of times that a bit is correctly decoded to a binary one.

15. The method of claim 14, wherein error statistics are collated for at least one frame that passes through the soft-decision LDPC decoder and the updates are used to dynamically tune a probability LUT for subsequent frames.

16. The method of claim 14, further comprising determining asymmetry errors in the error statistics and providing asymmetry information to a hard-decision LDPC decoder to adjust a bit flipping voting decision in response to the determined asymmetry.

17. The method of claim 12, wherein the information is provided by a probability generation module.

18. A solid state storage device, comprising:
  a non-volatile memory controller to store data in a non-volatile memory via a plurality of channels, wherein the stored data is encoded using a low density parity check code;
  a flash controller including a soft-decision Low Density Parity Check (LDPC) decoder to decode encoded data received from the non-volatile memory via respective channels of the plurality of channels; and
  the non-volatile memory controller collating error statistics in a decoded output of the soft-decision LDPC decoder to adjust a relationship between a set of soft-decision read values to a probability, the probability used by the soft-decision LDPC decoder to decode the encoded data.

19. The solid state storage device of claim 18, further comprising a hard-decision LDPC decoder wherein asymmetries in the monitored error statistics are used to adjust a bit flipping algorithm.

20. The solid state storage device of claim 18, wherein the non-volatile memory controller includes a statistics collation module collating error statistics in the output of the soft-decision LDPC decoder.

21. The solid state storage device of claim 18, wherein the probability is defined by a probability lookup table (LUT).

22. The solid state storage device of claim 21, wherein probability LUT probabilities are determined based on a set of parameters for a non-volatile memory page and updates based on the statistics in the decoded output of the soft-decision LDPC decoder.

23. The solid state storage device of claim 22, wherein the set of parameters comprises adjustable parameters for at least one of type of non-volatile memory page, scramble seed type, hard or soft information read from the non-volatile memory.

24. The solid state storage device of claim 22, wherein the non-volatile memory is a NAND flash memory.

25. The solid state storage device of claim 18, wherein the probability is provided by a probability generation module.

26. A method of decoding non-volatile memory pages of a non-volatile memory, comprising:
  collating error statistics in a decoded output of a soft-decision Low Density Parity Check (LDPC) decoder utilizing a probability to decode the non-volatile memory pages, the probability relating a set of soft-decision read values to a particular value;
  determining asymmetries in the collated error statistics of the soft-decision LDPC decoder; and
  utilizing the determined asymmetries to adjust a bit flipping voting decision of a hard-decision LDPC decoder.

27. The method of claim 26, wherein the probability is provided by a probability generation module.

28. A solid state storage device, comprising:
  a non-volatile memory controller to store data in a non-volatile memory via a plurality of channels, wherein the stored data is encoded using a low density parity check code;
  a flash controller including a soft-decision Low Density Parity Check (LDPC) decoder to decode encoded data received from the non-volatile memory via respective channels of the plurality of channels; and
  the non-volatile memory controller collating error statistics in a decoded output of the soft decision LDPC decoder, determining asymmetries in the collated errors of the soft-decision LDPC decoder, and utilizing the asymmetries to adjust bit flipping decisions of a hard decision LDPC decoder.

* * * * *